United States Patent [19]
Dini

[11] 4,108,659

[45] Aug. 22, 1978

[54] METHOD OF ENGRAVING PRINTING PLATES OF FORMS BY MEANS OF ENERGY BEAMS, ESPECIALLY LASER BEAMS

[75] Inventor: Mamiliano Dini, Island of Elba, Italy

[73] Assignee: European Rotogravure Association, Fed. Rep. of Germany

[21] Appl. No.: 600,804

[22] Filed: Jul. 31, 1975

Related U.S. Application Data

[63] Continuation of Ser. No. 391,256, Aug. 24, 1973, abandoned.

[30] Foreign Application Priority Data

Aug. 25, 1972 [DE] Fed. Rep. of Germany ....... 2241849

[51] Int. Cl.$^2$ ........................... G03C 5/00; G03C 5/04
[52] U.S. Cl. ..................................... 96/36.3; 96/27 R; 96/27 H; 96/36; 96/38.3; 358/299; 156/634; 156/643; 427/53; 346/76 L
[58] Field of Search .............. 96/36.3, 38.3, 36, 27 R, 96/27 H; 178/6.6 B; 156/634, 643; 427/53; 340/76 L

[56] References Cited

U.S. PATENT DOCUMENTS

| 3,567,447 | 3/1971 | Chand | 96/38.3 |
| 3,834,801 | 9/1974 | Schreckendgust | 96/38.3 |

*Primary Examiner*—Edward C. Kimlin
*Attorney, Agent, or Firm*—Cushman, Darby & Cushman

[57] ABSTRACT

A process for engraving printing surfaces with unmodulated energy beams by interposing a variable reflectivity mask between the energy beam source and the printing surface. The local reflectivity of the mask varies in correspondence with the tone graduation of the original to be printed and may be formed by conventional photographic or the like techniques directly on the printing surface or on a substrate carrier through which the energy beam is passable.

12 Claims, 4 Drawing Figures

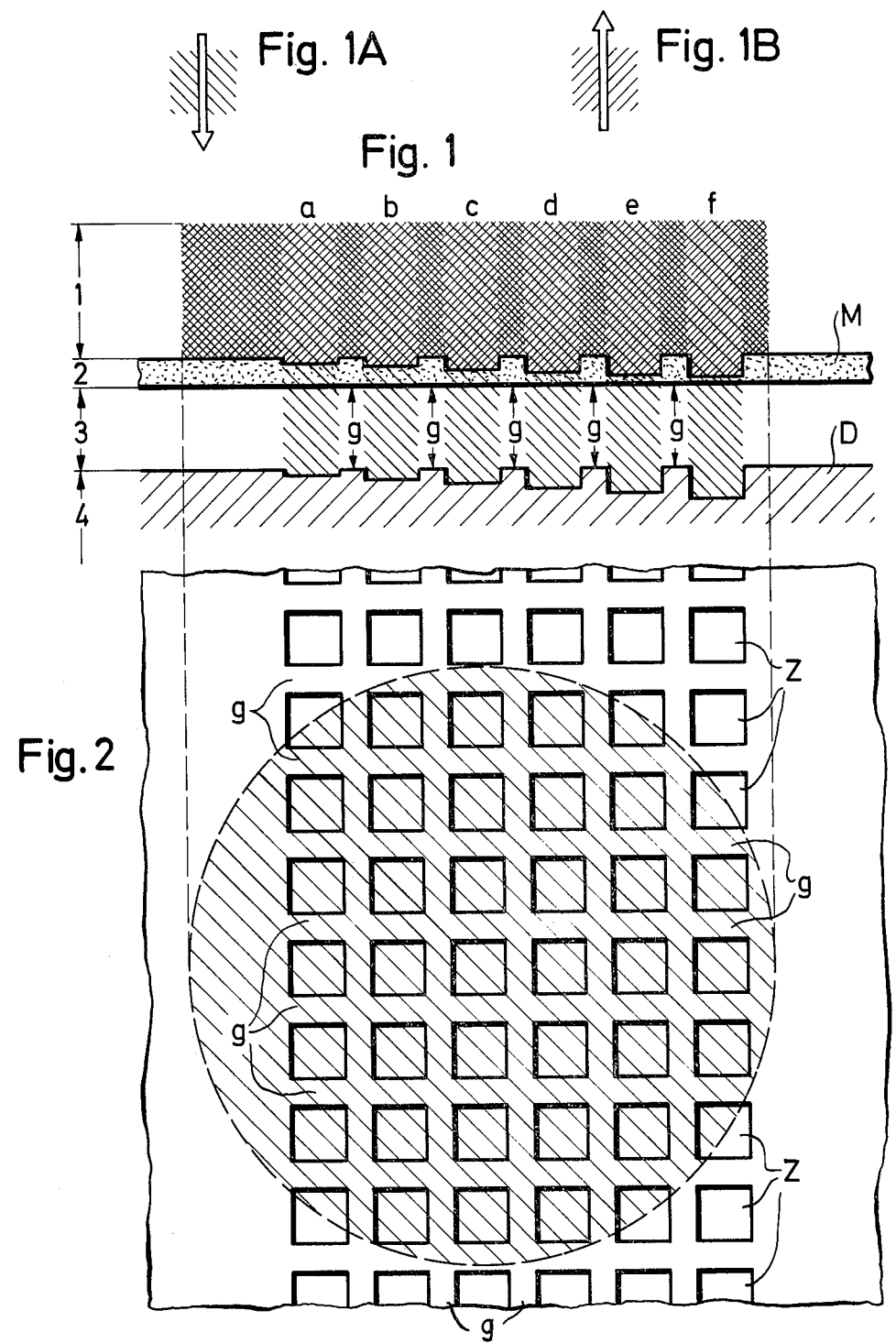

METHOD OF ENGRAVING PRINTING PLATES OF FORMS BY MEANS OF ENERGY BEAMS, ESPECIALLY LASER BEAMS

This is a continuation, of application Ser. No. 391,256 filed Aug. 24, 1973, now abandoned.

This invention generally relates to a technique for the production of printing surfaces.

As known, in the raster or screen intaglio printing process, the surface of the printing form, e.g. of the rotogravure cylinder, is provided with a plurality of cells, the surface area and/or depth of which each corresponds to the tone intensity of the image point of an original picture to be reproduced, which point is associated with a corresponding printing form cell.

The production of such cells is usually effected in accordance with two conventional methods, namely by removal of material either by means of chemicals or by means of mechanical or radiation energy.

In the chemical engraving process, the recessing of the individual cells corresponding to the original picture is modulated by means of a variable permeability mask or cover layer which covers the full surface of the printing form. The localized permeability to the etching liquid, e.g. an acid, is varied in correspondence with the value of the original picture points. The mask, as a unit, is porosity modulated, e.g. by a photographic process, in one single operation, and the action of the etching liquid is likewise allowed to occur over the full surface of the printing form at the same time.

On the other hand, in the case of engraving by means of mechanical tools or energy, especially by means of laser beams, all cells must be formed individually in succession — or, in the case of grouped tools, in successive groups — whereby the original picture is scanned for its contrast or tone contents point by point and the individual tone values, through electronic converters, are used for controlling the engraving effectiveness or performance of the energy pulses acting upon the respectively associated locations of the printing form.

This method is expensive in view of the required apparatus and perhaps also with respect to the time of processing, unless it is operated with energy beams pulsating at high frequencies.

Now, the present invention provides a possibility in which, even when engraving printing forms by means of energy beams and especially laser beams, the heretofore necessary point-by-point scanning of the original picture and, consequently, the modulation of energy and/or frequency of the etching beams can be avoided. The invention, to be described in more detail below, greatly improves the mechanical or energy beam engraving process by controlling the engraving power with the aid of a mask, the local beam affecting effect of which is modulated in correspondence with the tone graduation in the original picture, and adapts the performance of such principles to the particularities which form the basis of the power modulation of a laser beam.

Accordingly, the present invention resides in a method of engraving printing plates or forms by means of energy beams, especially laser beams, the characterizing primary feature of which consists in using an energy beam, especially a laser beam, unmodulated with respect to its energy and frequency, and modulating the etching of the individual engraved cells with respect to surface area and/or depth by the energy beam in correspondence with the tone graduation of the respectively associated image point of the original picture with the aid of a mask positioned in the path of radiation between the source of the energy beam and the printing form surface to be etched or engraved, the reflectivity of which mask for the energy beam is inversely proportional to the tone graduation of the original picture. To put it in other words, the energy beam is reflected from the mask in those regions thereof which correspond to the white locations of the original picture, at least to such degree that the regions of the printing form associated with these mask portions are left unetched, while the lowest reflectivity is present in those portions of the mask which correspond to the deepest or maximum tone graduations of the original picture so that their associated regions of the printing form must show cells of maximum volume.

Thus, it is apparent from the above discussion of the present invention that the latter is not restricted to the mere transfer or adoption of the masking principle from the chemical etching process to the energy beam etching of engraved cells, but also comprises the specific adaption of the masking effect and masking qualities to the new field of use, namely to the etching by means of an energy beam.

This special characteristic of the mask to be used here has not previously occurred to those working in the field of cell etching by means of energy beams and especially laser beams, perhaps because the nature and mode of functioning of such beams in their previous utilization as etching or engraving means caused such persons to think only of an electronic modulation of the beam for such purposes.

Moreover, the use of the masking principle in the beam etching provides the technically advantageous and not at all foreseeable possibility of working with energy beams, e.g. laser beams, the energy level of which is much higher than the energy values with which it is possible to operate in the previous scanning beam modulation techniques. This special effect is due to the fact that the prior modulation technique for such high beam energy for the successive formation of individual cells requires working at very high frequencies if reasonable working speed is to be obtained, i.e. the engraving of a sufficient number of cells per unit of time, or if an excessive period of time for the final preparation of a printing form is to be avoided. Up to now, however, there have not yet been available energy beam generators, e.g. laser beam generators, which combine the two properties of producing beams of high energy level at high pulse repetition rates. The present invention eliminates the disadvantageous nonavailability of such generators in the case of the conventional mode of operation by means of etching beams modulated through scanning devices.

The modulation of the etching power of the beam in accordance with the original picture as according to the invention, by means of a mask being locally modulated with respect to its reflectivity, in addition to the above-mentioned technical advantage provides still further advantages. These include, for example, the principal omission of electronic devices for modulating the energy and/or the frequency of the primary energy beam, and further the possibility of scanning the surface of the printing form with an energy beam, the (cross-sectional) area of which is a multiple of the corresponding surface area of the cell to be etched to maximum degree, which simplifies the guiding of the beam, and, moreover, the labor savings in the production of the mask, the locally different reflectivity of which may be produced in accordance with various conventional methods known from other fields of technology which are based upon light photographic, electrophotographic or galvano technical principles for creating a varying thickness of material which corresponds in thickness to an original light image. One such method is used in the conventional process of etching a photographic image on a printing plate. The mask may be made using the conventional etching or engraving process and then used in the high-speed efficient process of the instant invention.

As it can be seen from the preceding, the term "mask" used for the characterization of the invention is intended to mean the general principle of function, and not perhaps a specific physical embodiment. The principle of function, namely the local "modulation" of the reflectivity in correspondence with the original picture, with respect to the etching beam is discussed in detail above.

In its physical configuration, the mask comprises the reflective layer according to the invention and a carrier or substrate which together form a compound or laminate structure. This structure may be positioned as a self-supporting, thin body with glass, plastics material or another substance permeable to the energy beam, as the substrate material, at a suitable place between the beam source and the printing form, whereby, obviously, the modulated reflective layer may be constructed distortedly in accordance with the beam path between the substantially spot-shaped beam source and the shape of the printing form surface to be etched. A mask of this type may be used repeatedly for the production of a plurality of identically configured printing forms.

Another, particularly preferred embodiment of the mask according to the invention consists in that the printing form, e.g. the rotogravure cylinder per se, is used as the carrier or substrate for the modulated reflective layer. For example, the printing form surface to be etched is coated with a light sensitive layer upon which the original picture to be reproduced (along with the customary raster or screen) is printed either with direct contact or by means of projection. Such printing may be effected by exposure of the whole surface or, for example, with the interposition of a slit mask in line-, or stripshaped pattern. The resulting latent image is then developed by light or electrophotographic means, whereby, in the first instance, the silver image, when a light sensitive halosilver layer is used, is developed with different brightnesses corresponding to the modulation, or is converted into an image of another metal in a toner bath. In the case of the electrophotographic development, a toner filled with a glossy metal pigment is used. Furthermore, as mentioned above, the modulated reflective layer may be produced by galvano techniques. The practical performance of the above-mentioned methods of producing the reflective layer is made in the customary, well-known manner.

A fuller understanding of the invention may be had by referring to the following detailed description in conjunction with the accompanying drawings, of which:

FIG. 1 is a cross-sectional depiction of an ongoing engraving process according to this invention;

FIGS. 1A and 1B are explanatory diagrams helpful in interpreting the direction of energy propagation in FIG. 1; and FIG. 2 is a plan view of the process depicted in FIG. 1.

Referring first to FIG. 2, a plan view of at least part of an engraving process is depicted in accordance with this invention. The usual kind of screen (g) structure is shown in the mask (M) having "apertures" (Z) with individual reflectivities inversely proportional to the tone gradation of a corresponding elemental area of an original picture or the like represented by the mask and to be reproduced by a printing process. That is, the areas (g) of the mask (M) are of maximum reflectivity so as to reflect as much as possible of the energy beam, which, for instance, is represented by the dotted circular outline filled in with hash marks in FIG. 2. As can be seen in FIG. 2, the energy beam (emanating from a source positioned above the plane of FIG. 2) can simultaneously process a plurality of the elemental cells or areas (Z) which have varying reflectivities in accordance with the tonal gradation of an original picture or the like, and as previously discussed. The printing surface to actually be engraved by energy passing through the mask (M) is then located beneath the mask (M) or below the plane of FIG. 2.

Perhaps a better visualization of the process being described can be had by referring to FIG. 1, where a cross-sectional depiction of FIG. 2 is presented.

First of all, reference should be made to FIGS. 1A and 1B, showing that incident energy has been depicted in FIG. 1 by lines extending diagonally downward from the left, while reflected energy has been depicted by lines extending diagonally upward from the left.

Accordingly, when FIG. 1 is considered, it will be seen readily that incident energy of substantially constant and uniform intensity emanates from above onto a section of the mask (M). It will be seen in cross-section that the mask (M) has elemental areas or cells (Z) of successively diminishing thicknesses from left to right corresponding to reference letters A-F in FIG. 1. Inbetween these elemental areas are the usual screen areas having the maximum amount of reflectivity.

As will be seen in FIG. 1, the first cell (a) in mask (M) has retained a substantial portion of the reflective material thereat, thus reflecting a substantial part of the incident energy back towards the source and permitting a relatively small proportion of the incident energy to pass therethrough onto the surface of a printing plate or the like (D). Likewise, the other cell areas b-f are successively less reflective, thus permitting a corresponding successively increasing proportion of the incident energy to pass through the mask (M) rather than to be reflected therefrom. Accordingly, as shown in FIG. 1, the engraved cell areas on the printing surface (D) are successively greater in depth. Of course, in an actual situation, the reflectivities of the various cell areas are chosen in accordance with the tonal gradation of corresponding elemental areas or cells of an original picture, as should now be appreciated.

As the reflective material, preferably there are used metals having a particularly high coefficient of reflectivity for the wavelength range of about 10 $\mu$ in which the usual laser types, e.g. a $CO_2$ laser, emit. Metals of this type are, for instance, aluminum, magnesium and, preferably, silver (95%), all of which have a coefficient of reflectivity of about 99.9%.

The increased output of the printing form etching process by use of the mask control of the laser beam as according to the invention is evident from the following calculations:

Let us assume that the printing form to be etched comprises a rotogravure cylinder of an axial length of 2 meters and a circumference of 1 meter, that a typical screen of 70 cells per centimeter is employed, and that the laser beam has a diameter of 3 millimeters which beam wipes the cylinder in contiguous paths being parallel to each other and to the cylinder axis. Then, the beam at each instant covers a cylinder area of 7 mm$^2$, corresponding to an area covered by about 350 engraved cells. At a customary speed of rotation of the cylinder in the range of 60 rpm, the total time to scan or cover the entire cylinder circumference will then be about only 10 minutes, which time is comparable with the time for the conventional chemical etching process of about 15 minutes, and provides a speed-up factor of 3:1 and of 5:1 in comparison with the mechanical or tool etching or engraving.

A further, substantial shortening of the time required for machining the cylinder can be achieved by using — in a manner which may be easily realized by corresponding devices — two or more laser beams simultaneously processing the cylinder carrying the mask, and by the doubling or even multiplication of the speed of rotation of the cylinder, which can be achieved particularly when using high energy laser beams.

Although only a few embodiments of my invention have been specifically described, those in the art will appreciate that there are many obvious variations and modifications of the described invention and therefore to be included within the scope of this invention.

What is claimed is:

1. A method for engraving a printing surface with an energy beam, said method comprising:

preparing a reflective mask having a plurality of elemental areas which are adapted to reflect and to pass varying amounts of energy from said energy beam, the amount of energy passable by any given area being representative of the tone gradation of a corresponding area of an original to be engraved upon said printing surface and subsequently reproduced thereby in a printing process, said preparing step including the steps of providing a basic mask material which substantially reflects said energy beam and forming a plurality of individual cells of differing reflectivity in said mask, said reflectivity being inversely related to the depths of corresponding cells to be engraved in said printing surface whereby the reflectivity of the cells in any given area of said mask with respect to the energy beam is inversely proportional to the tone gradation of a corresponding area of the original to be engraved into said printing surface, and energy not reflected is substantially passed through the mask, providing an energy beam of substantially constant energy value, said energy beam having a cross sectional area encompassing a plurality of said elemental areas over the masked printing surface, and interposing said mask between said printing surface and the source of said energy beam such that said energy beam simultaneously illuminates a plurality of said individual cells, whereby said elemental areas are etched onto said printing surface corresponding to the amount of energy passed through respectively associated elemental areas of said mask.

2. A method as in claim 1 wherein said preparing step comprises the formation of elemental areas having constant dimensions but varying energy reflecting capabilities, each elemental area being surrounded by material that substantially reflects said energy.

3. A method as in claim 1 wherein said preparing step comprises the formation of elemental areas having variable dimensions and substantially constant energy reflecting capabilities, each elemental area being surrounded by material that substantially reflects said energy.

4. A method as in claim 1 wherein said preparing and interposing steps comprise the formation of a layer of reflective material directly on top of said printing surface.

5. A method as in claim 1 wherein said preparing step comprises the formation of a layer of reflective material on a substrate which substantially transmits said energy beam therethrough.

6. A method as in claim 1 wherein the reflective mask is formed from a material comprising silver.

7. A method as in claim 1 wherein the reflective mask is formed from a material comprising metal having a high reflectivity for wavelengths of about 10 m.

8. A method as in claim 1 wherein said providing step comprises scanning a plurality of energy beams over the masked printing surface.

9. The method according to claim 1 wherein the printing form surface to be engraved is processed by means of an energy beam, the cross-sectional area of which is a multiple of the corresponding surface area of the engraved cell to be etched to maximum degree.

10. The method according to claim 8 wherein the printing form surface to be engraved is processed with two or more energy beams at the same time.

11. The method according to claim 1 wherein a mask in the form of a thin, sheet-like laminate body is used, which body comprises a carrier or substrate permeable to the energy beam and a layer of modulated reflectivity for the energy beam disposed on said carrier or substrate.

12. The method according to claim 1 wherein there is used a mask in the form of a layer of modulated reflectivity for the energy beam which adheres to the printing form surface to be etched or engraved.

* * * * *